US006524727B1

(12) United States Patent
Kathirgamanathan

(10) Patent No.: US 6,524,727 B1
(45) Date of Patent: Feb. 25, 2003

(54) ELECTROLUMINESCENT MATERIAL

(75) Inventor: Poopathy Kathirgamanathan, Middlesex (GB)

(73) Assignee: South Bank University Limited, London (GB)

( * ) Notice: Subject to any disclaimer, the term of this patent is extended or adjusted under 35 U.S.C. 154(b) by 0 days.

(21) Appl. No.: 09/466,523

(22) Filed: Dec. 17, 1999

Related U.S. Application Data

(63) Continuation of application No. PCT/GB98/01773, filed on Jun. 17, 1998.

(30) Foreign Application Priority Data

Jun. 17, 1997 (GB) ............................................. 9712483

(51) Int. Cl.$^7$ ............................................. H05B 33/14

(52) U.S. Cl. ....................... 428/690; 428/704; 428/917; 313/504; 313/506; 252/301.16; 252/301.26; 257/40; 257/103

(58) Field of Search ................................. 428/690, 704, 428/917; 313/504, 506; 252/301.16, 301.26; 257/40, 103

(56) References Cited

U.S. PATENT DOCUMENTS

| | | | |
|---|---|---|---|
| 4,356,429 A | 10/1982 | Tang | |
| 4,455,364 A | 6/1984 | Sasa | |
| 4,720,432 A | 1/1988 | VanSlyke et al. | |
| 4,885,211 A | 12/1989 | Tang et al. | |
| 5,128,587 A | 7/1992 | Skotheim et al. | 313/504 |
| 5,281,489 A | * 1/1994 | Mori et al. | 428/690 |
| 5,435,937 A | * 7/1995 | Bell et al. | 252/301.18 |
| 5,755,999 A | 5/1998 | Shi et al. | |
| 5,756,224 A | 5/1998 | Borner et al. | 428/690 |
| 5,757,026 A | 5/1998 | Forrest et al. | |

FOREIGN PATENT DOCUMENTS

| | | |
|---|---|---|
| EP | 0087309 | 2/1983 |
| EP | 0278629 | 1/1988 |
| EP | 0461542 | 6/1991 |
| EP | 0569827 | 5/1993 |
| EP | 0556005 | 8/1993 |
| EP | 0744451 | 11/1996 |
| EP | 0936844 | 2/1999 |
| JP | 61037887 | 2/1986 |
| JP | 3289089 A2 | 4/1990 |
| JP | 6145146 | 6/1992 |
| JP | 06145146 | 5/1994 |
| WO | 9802018 | 1/1998 |
| WO | 9855561 | 12/1998 |

OTHER PUBLICATIONS

JP3196494A2 "Dispersed Thin Film Light Emitting Element" Abstract, Aug. 27, 2001.
JP3289090A2 "Organic Complex Light Emitting Device" Abstract, Dec. 19, 1991.
Junji Kido, et al. "Multilayer White Light–Emitting Organic Electroluminescent Device" Science, Mar. 1995, vol. 267 pp. 1332–1334.
JP 3196492A2 "Thin Film Light Emitting Element" Abstract Aug. 27, 1991.
JP3196493A2 "Laminated Thin Film Ligh Emitting Element" Abstract, Aug. 27, 1991.
N.C. Greenham et al., Measurement of absolute photoluminescence quantum efficiencies in conjugated polymers, Chemical Physics Letters, 241, (1995) pp. 89–96. (No month).
Lin Liu et al., Europium complexes as emitters in organic electroluminescent devices, Synthetic Metals, 91, (1997) pp. 267–269. (No month).
S. Dirr et al., Luminescence enhancement in microcavity organic multilayer structures, Synthetic Metals 91 (1997) pp. 53–56. (No month).
Junji Kido et al., White–Light–Emitting Organic Electroluminescent Device Using Lanthanide Complexes, J. Appl. Phys. vol. 35 (1996) pp. 394–396. (No month).
Junji Kido et al., Electroluminescence in a Terbium Complex, Chemistry Letters, (1990) pp. 657–660. (No month).
Junji Kido et al., Bright red light–emitting organic electroluminescent devices having a europium complex as an emitter, Appl. Phys. Lett., 65 pp. 2124–2125. (No date).
U.S. patent application Ser. No. 09/830,897, Kathirgamanathan, filed May 2, 2001.
U.S. patent application Ser. No. 09/857,287, Kathirgamanathan, filed Jun. 1, 2001.
U.S. patent application Ser. No. 09/890,431, Kathirgamanathan, filed Jul. 30, 2001.
U.S.patent application Ser. No. 09/857,300, Kathirgamanathan, filed Jun. 1, 2001.
U.S. patent application Ser. No. 09/857,286, Kathirgamanathan, filed Jun. 1, 2001.
Y. Hamada, et al., Blue Electroluminescence in Thin Films of Azomethin–Zinc Complexes, Japanese Journal of Applied Physics; vol. 32 (1993) Apr. 1 No. 4A; pp .L 511–L513.
M. Berggren, et al., Ultraviolet Electroluminescence from an Organic Light Emitting Diode, Advance Materials, 7 (1995) November, No. 11; pp. 900–903.

(List continued on next page.)

*Primary Examiner*—Deborah Jones
*Assistant Examiner*—Ling Xu
(74) *Attorney, Agent, or Firm*—Pitney, Hardin, Kipp & Szuch LLP

(57) ABSTRACT

Electrolumiinescent devices with a high photoluminescent efficiency comprise a transparent conductive substrate on which is a layer of an electroluminescent material. The electroluminescent material is a rare earth metal, actinde or transition metal organic complex which has a photoluminescent efficiency of greater than 25%.

13 Claims, 13 Drawing Sheets

OTHER PUBLICATIONS

Nicola Armaroli, et al., Luminescence properties of Eu 3+, Tb3–, and Gd 3+ complexes of the hexadentate N–donor podand tris–[3–(2–pyridyl)pyrazol–lyl]hydroborate, Chemical Physics Letters, 276 (1997), pp. 435–440 (No month).

K. Hensen, et al., Darstellung Von N–BZW. O–Chlormethylsilyl–Derivaten der Amine 1,2,3,4–Tetrahydro–1, 10–Phenanthrolin und 8–Hydroxychinolin, Journal of Organometallic Chemistry, 209 (1981) pp. 17–23 (No month).

J. Kido, et al., Organic Electroluminescent Devices Using Lanthanide Complexes, Department of Materials Science and Engineering, Yamagata University, Yamagata, 992, Japan. 1995 pp. 110–111 (No month).

C. J. Kepert, et al., Structural Systematics of Rare Earth Complexes. V+ The Hydrated 1:1 Adducts of 2,2':6', 2"—Terpyridine with the Lanthanoid(III) Chlorides; Australia Journal of Chemistry, 1994,47, pp. 365–384 (No month).

K. Machida, et al., Redox Behavior and Luminescence Property of Europium Polymer Complexes, Department of Applied Chemistry, Faculty of Engineering, Osaka University, 1991, pp. 270–21 (No month).

K. Hayashi, et al., Syntheses and Structural Studies of Lanthanide Mixed Ligand Complexes containing B–diketone, Department of Chemistry, Faculty of Science, Ochanomizu University, Tokyo, Japan, 1996, pp. 210–211 (No month).

K. Tsuchiya, et al., Complex Formation and its High Dispersion in the Simultaneous Vacuum Deposition of Copper and Pthalocyanine, Faculty of Engineering, Yamagata University, Yonezawa, Japan, 1998 pp. 149–154 (No month).

L. K. Templeton, et al., Anomalous Scattering by Praseodymium, Samarium and Gadolinium and Structures of their Ethylenediaminetetraacetate (edta) Salts, Materials and Molecular Research Division, Lawrence Berkeley Laboratory and Department of Chemistry, University of California, Berkeley, California, 1982 pp. 2155–2159 (No month).

T. Wakimoto, et al., Organic EL cells with high luminous efficiency, Applied Surface Science 113/114 (1997) pp. 698–704 (No month).

Hosokawa Chishio, "Thin–Film EL Element", Publication No. 1–256584, Apr. 7, 1988, Laid Open Patent Gazette.

C. Hosokawa, "Thin Film EL Element", Publication No. I–282291, Nov. 14, 1989, Laid Open Patent Gazette.

* cited by examiner

ELECTROLUMINESCENT MATERIAL

This continuation of copending application PCT/GB98/01773 filed Jun. 17, 1998 which is incorporated by reference herein.

The present invention relates to electroluminescent materials and to devices incorporating them.

BACKGROUND OF THE INVENTION

Materials which emit light when an electric current is passed through them are well known and used in a wide range of display applications. Liquid crystal devices and devices which are based on inorganic semiconductor systems are widely used, however these suffer from the disadvantages of high energy consumption, high cost of manufacture, low quantum efficiency and the inability to make flat panel displays.

Organic polymers have been proposed as useful in electroluminescent devices, but it is not possible to obtain pure colours, they are expensive to make and have a relatively low efficiency.

Another compound which has been proposed is aluminium quinolate, but this requires dopants to be used to obtain a range of colours and has a relatively low efficiency.

In an article in Chemistry letters pp 657–660, 1990 Kido et al disclosed that a terbium III acetyl acetonate complex was green electroluminescent and in an article in Applied Physics letters 65 (17) 24 October 1994 Kido et al disclosed that a europium III triphenylene diamine complexes was red electroluminescent but these were unstable in atmospheric conditions and difficult to produce as films.

The complexes disclosed in these articles had a low photoluminescent efficiency and were only able to produce green or red light and other colours could not be produced.

We have now discovered electroluminescent materials which have a higher photoluminescent efficiency and which can produce a range of colours, which has hitherto been difficult to produce.

SUMMARY OF THE INVENTION

The higher photoluminescent efficiency enables these materials to be used in a range of applications.

According to the invention there is provided an electroluminescent device comprising a transparent substrate on which is formed a layer of an electroluminescent material in which the electroluminescent material is a rare earth metal, actinide or transition metal organic complex which has a photoluminescent efficiency (PL) of greater than 25%.

The photoluminescent efficiency is a measure of the efficiency of conversion of absorbed light to emitted light and can be measured as described in the Article in Chemical Physics Letters 241 (1995)89–96 by N. C. Greenham et al.

Another measure which has been used for measuring efficiencies is based on the consumption of electricity by the material (the electroluminescent efficiency).

The metal complexes of the present invention have the formula $X(Y_1)(Y_2)(Y_3)$ where X is a rare earth, transition metal, lanthanide or an actinide in the III state and $Y_1$, $Y_2$, $Y_3$ are the same or different organic complexes. When the metal is in the II state e.g. Eu II, there will be two Y groups and when the metal is the IV state there will be four Y groups.

Rare earth chelates are known which fluoresce in ultra violet radiation and A. P. Sinha (Spectroscopy of Inorganic Chemistry Vol. 2 Academic Press 1971) describes several classes of rare earth chelates with various monodentate and bidentate ligands.

Group III A metals and lanthanides and actinides with aromatic complexing agents have been described by G. Kallistratos (Chimica Chronika, New Series, 11, 249–266

(1982)). This reference specifically discloses the Eu(III), Tb(III) and U(III) complexes of diphenyl-phosponamidotriphenyl-phosphoran.

EP 0744451A1 also discloses fluorescent chelates of transition or lanthanide or actinide metals.

The known chelates which can be used are those disclosed in the above references including those based on diketone and triketone moities.

In order to produce a material with a high PL and which electroluminesces at the desired colour, the nature of the ligand and the metal are specifically chosen.

Preferably a metal ion having an emission frequency and a resonant frequency with efficient transition between these frequencies are chosen and the ligand has a triplet energy level slightly above the resonant level of the metal ion.

Preferably the triplet state of the ligand or chelate is no greater than 0.7 eV the resonant frequency of the metal ion and more preferably no greater than 0.4 eV above the resonant frequency of the metal ion. Suitable ranges are from 0.1 to 0.7 eV.

Figure 1:
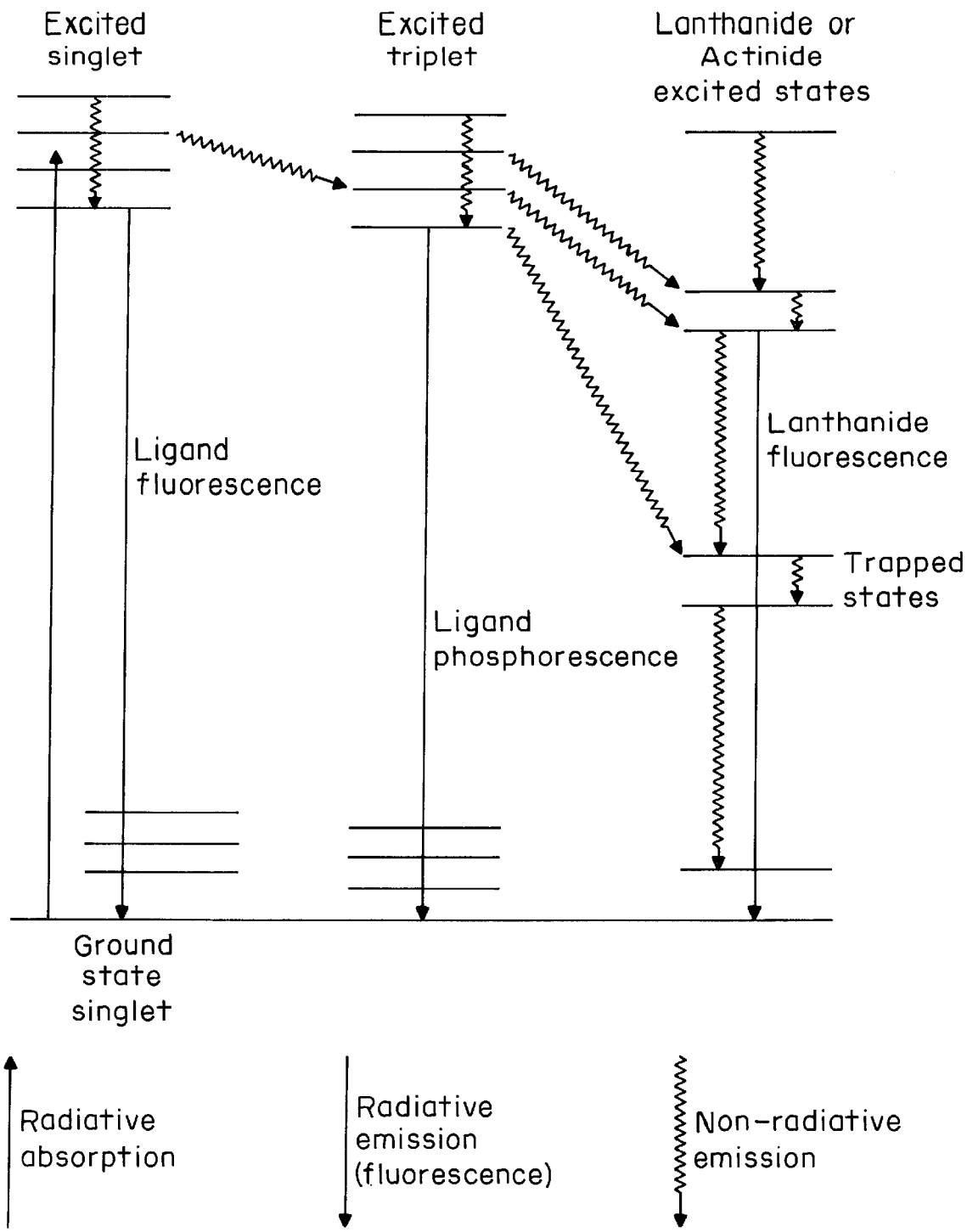
FIG. 1 is a diagrammatic illustration of light absorption and emission processes for a material having a high photoluminescent efficiency.
Figure 2A:
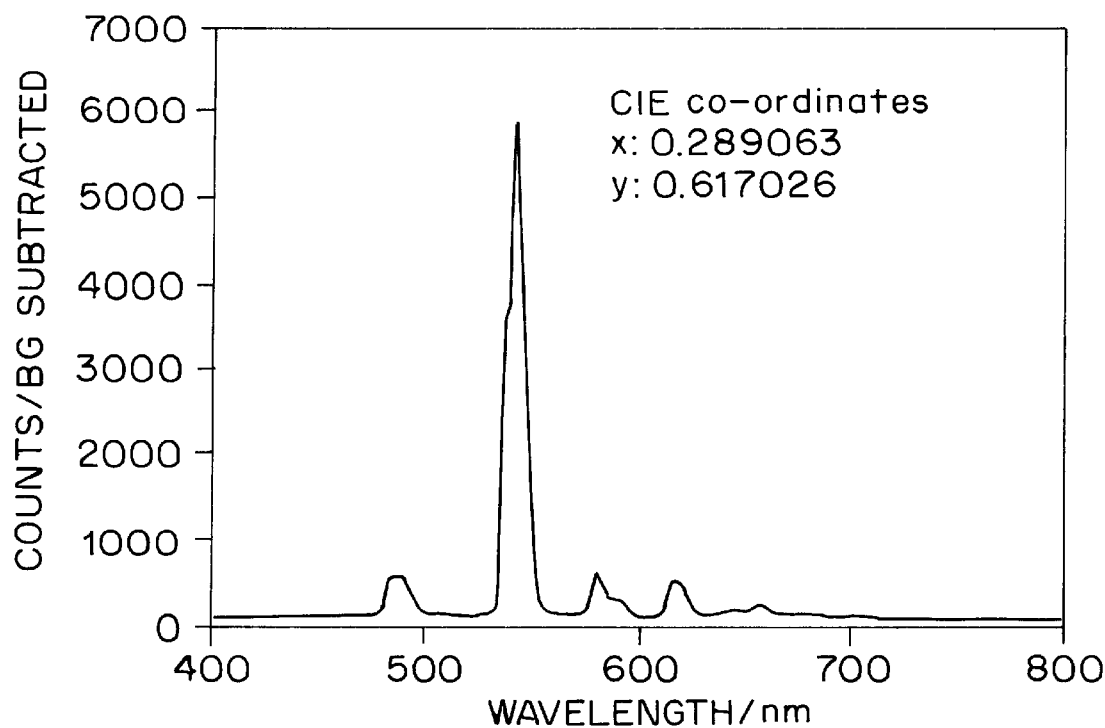
FIGS. 2(a) and 2(b) are graphs of counts versus wavelength and radiance versus wavelength, respectively, for a tris(2,2,6,6-tetramethyl-3-5-heptanedienato) Terbium (III) diphenyl phosphonimide tris-phenyl phosphorane substrate in accordance with the invention.
Figure 2B:
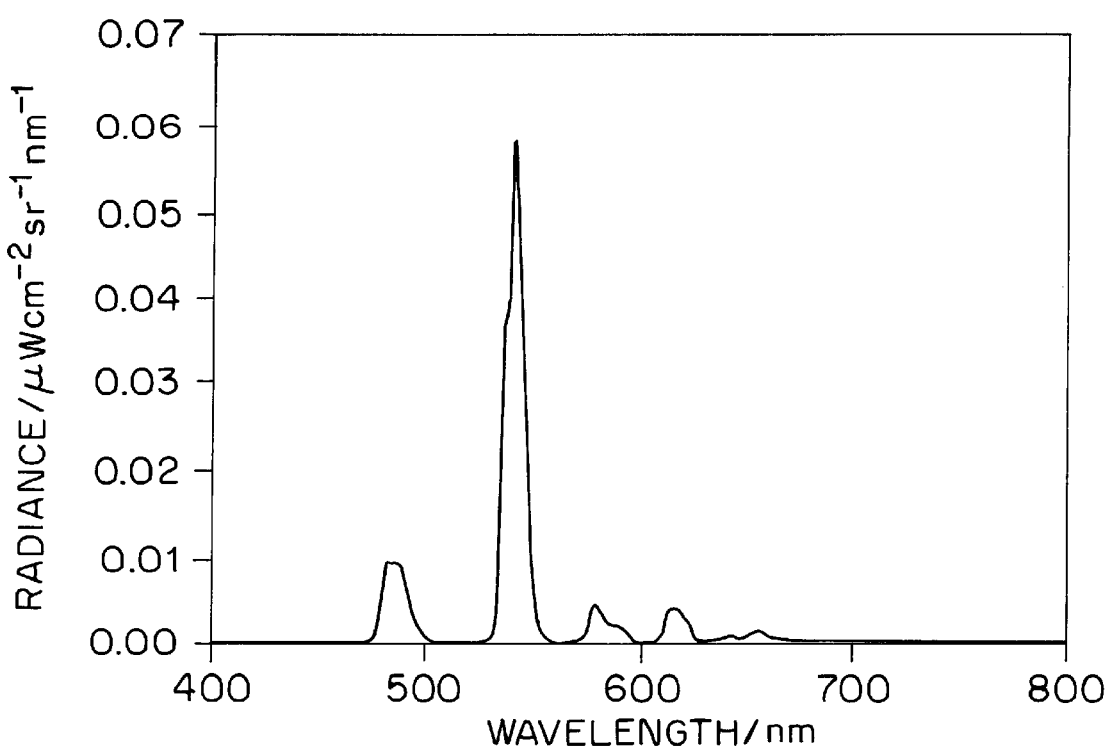
Figure 3A:
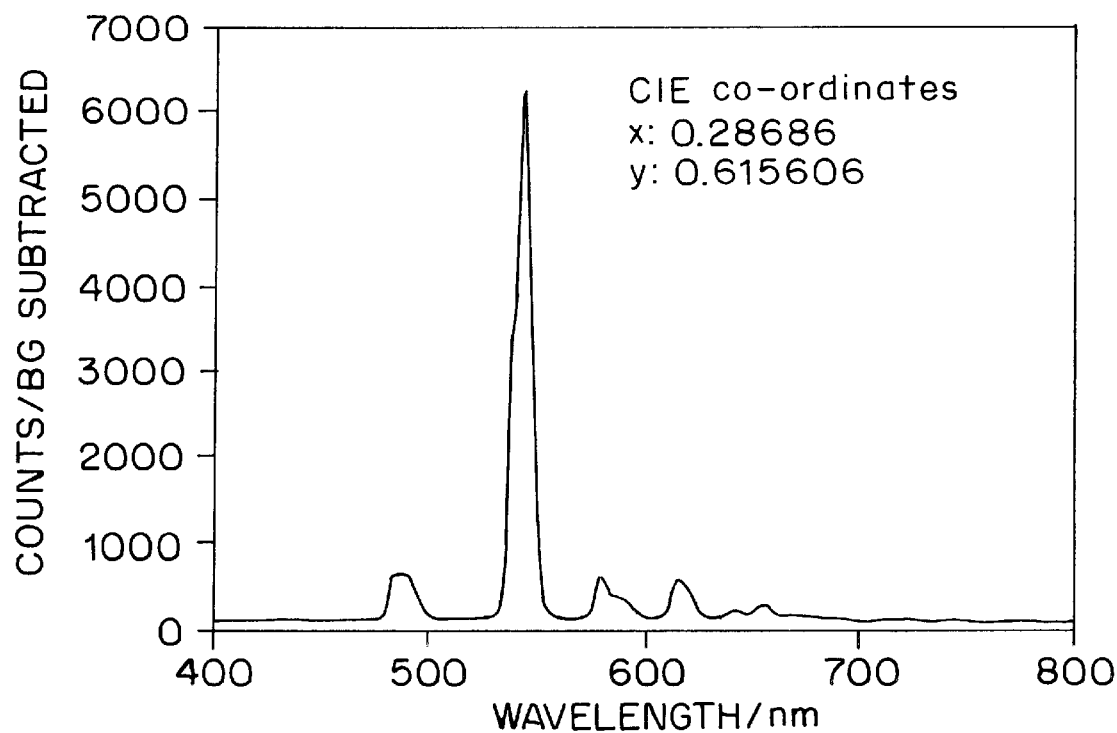
FIGS. 3(a) and 3(b) are graphs of counts versus wavelength and radiance versus wavelength, respectively, for a tris(2,2,6,6-tetramethyl-3,5-heptanedionato) Terbium (III) diphenyl phosponimide tris-(methoxyphenyl) phosphorane substrate in accordance with the invention.
Figure 3B:
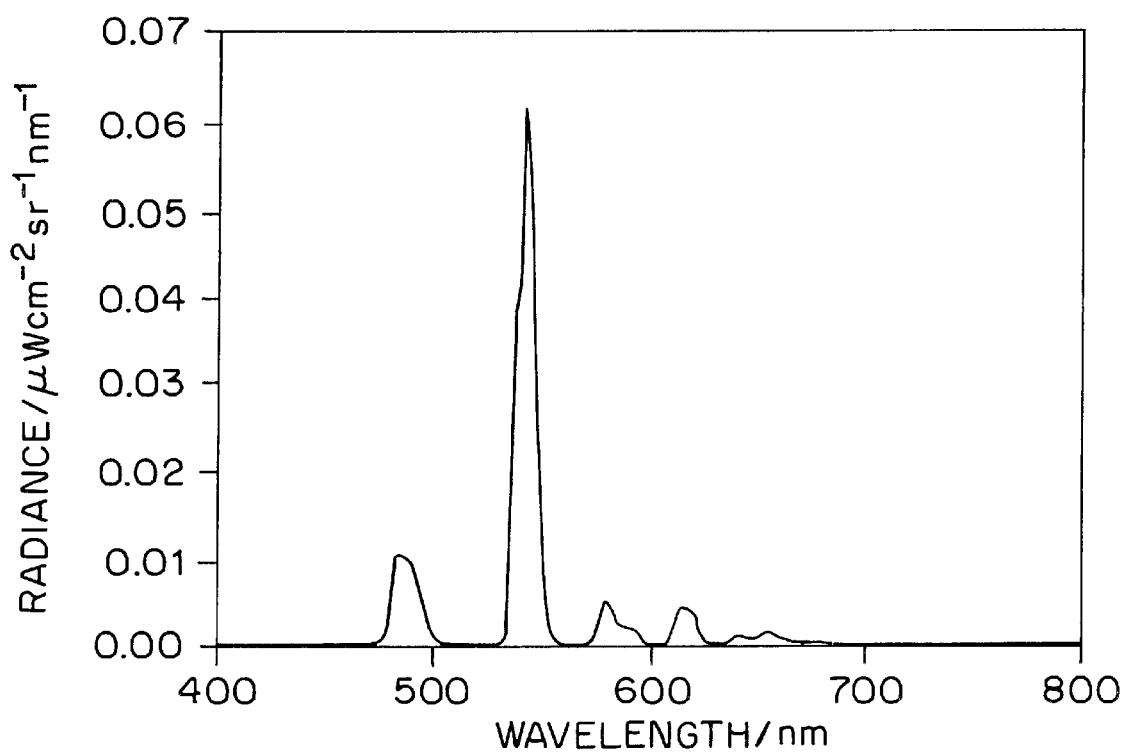
Figure 4A:
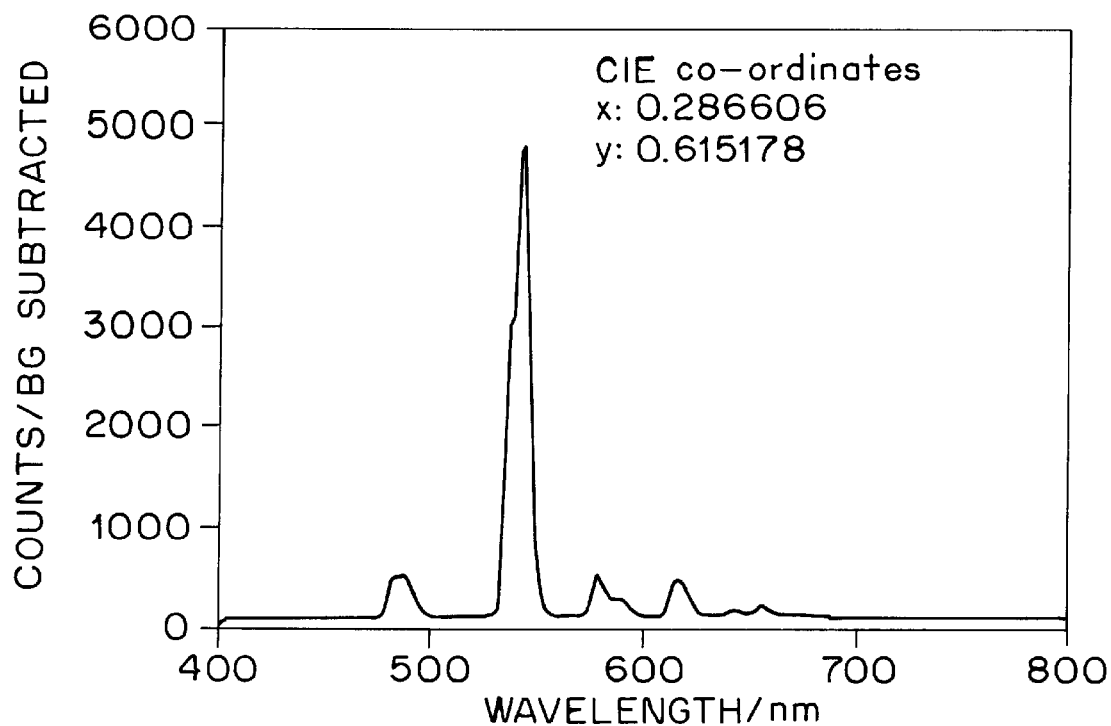
FIGS. 4(a) and 4(b) are graphs of counts versus wavelength and radiance versus wavelength, respectively, for a tris (2,2,6,6-tetramethyl-3,5-heptanedionato) Terbium (III) diphenyl phosponimide tris-(fluorophenyl) phosphorane substrate in accordance with the invention.
Figure 4B:
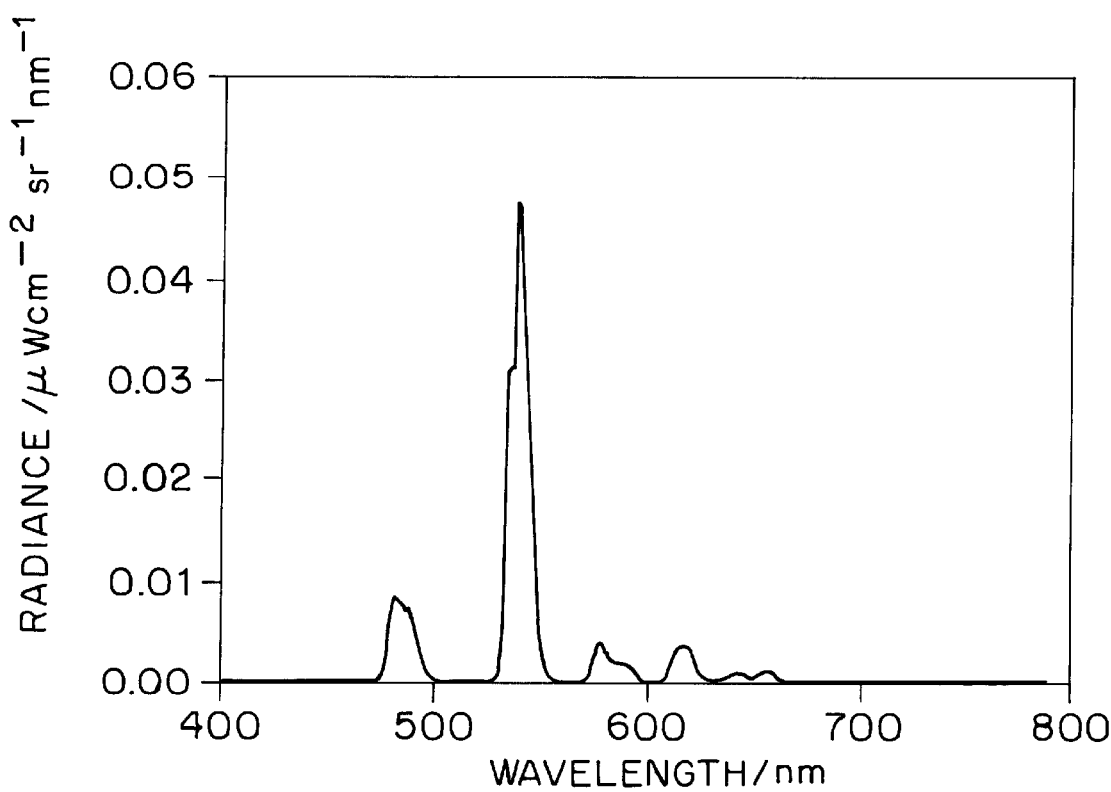
Figure 5A:
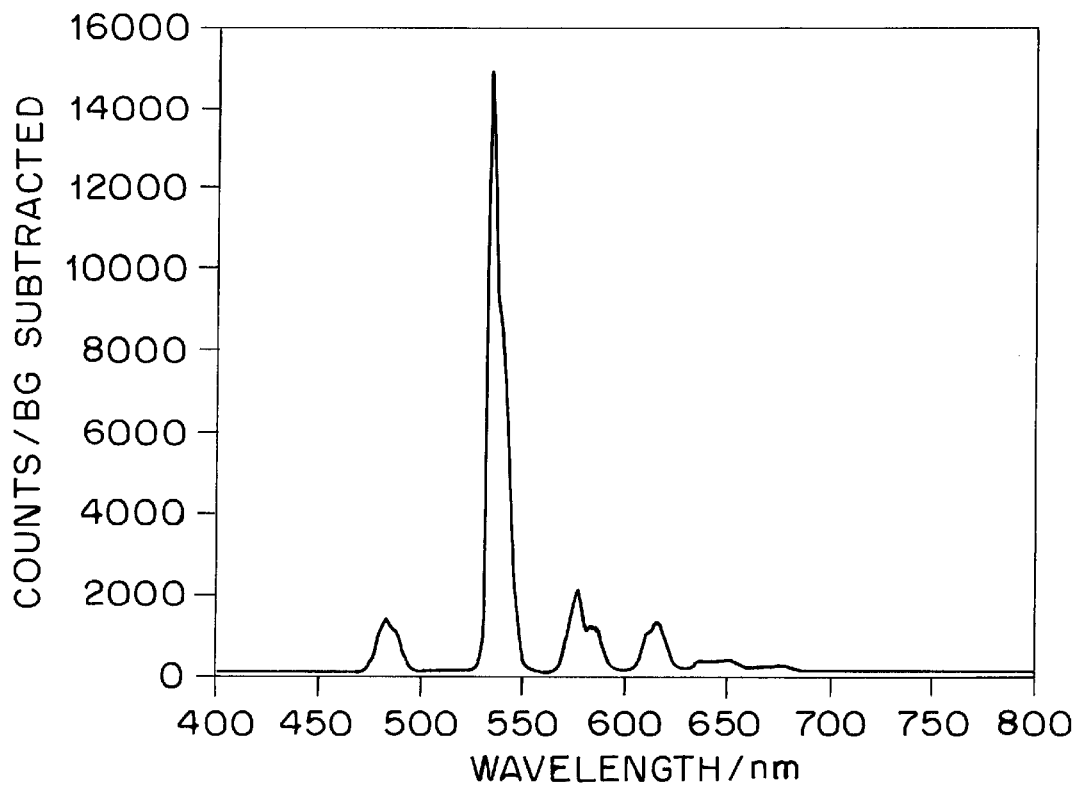
FIGS. 5(a) and 5(b) are graphs of counts versus wavelength and radiance versus wavelength, respectively, for a tris $(2,2,6,6^1$-tetramethyl-3,5-heptanedionato) Terbium (III) mono-di-(2-pyridyl) ketone substrate in accordance with the invention.
Figure 5B:
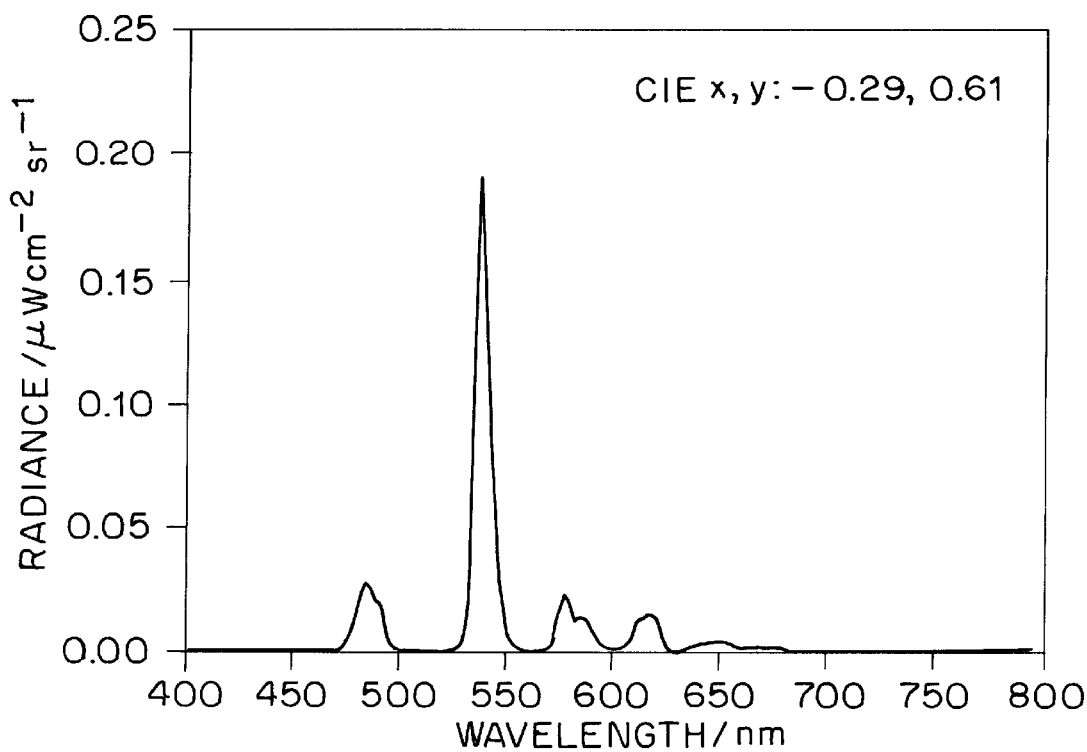
Figure 6:
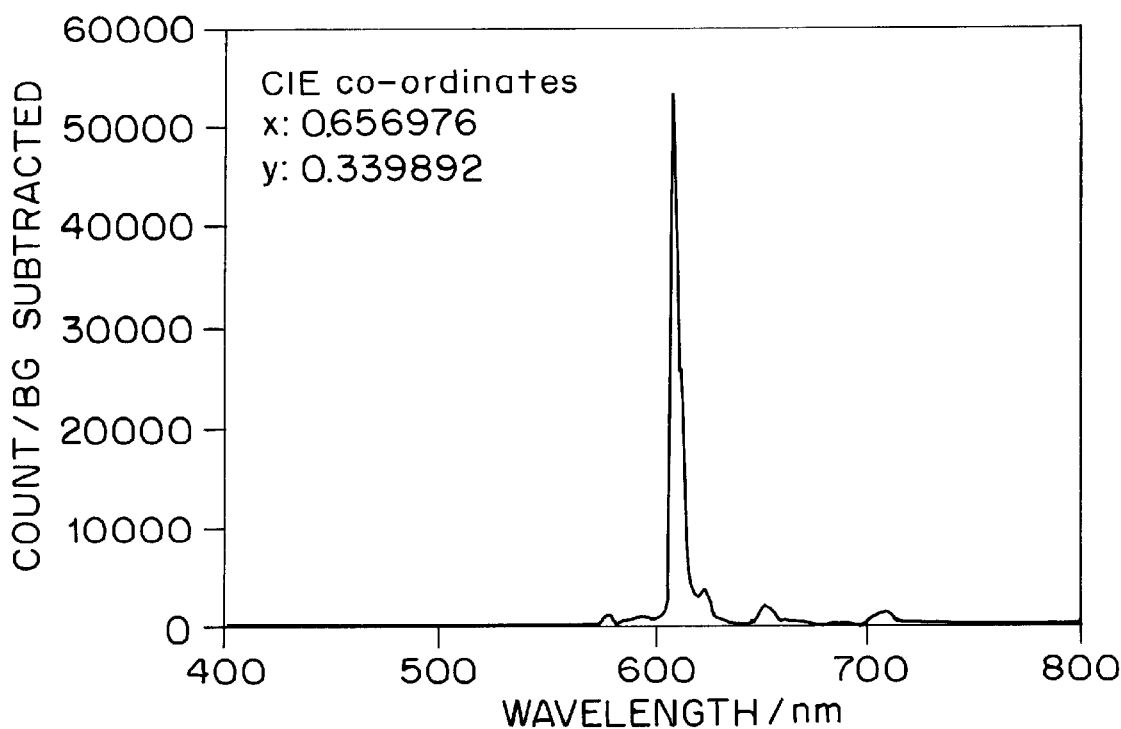
FIGS. 6(a) and 6(b) are graphs of counts versus wavelength and radiance versus wavelength, respectively, for a Europium (III) dibenzoyl methane diphenyl phosphonimide triphenyl phosphorane substrate in accordance with the invention.
Figure 6:
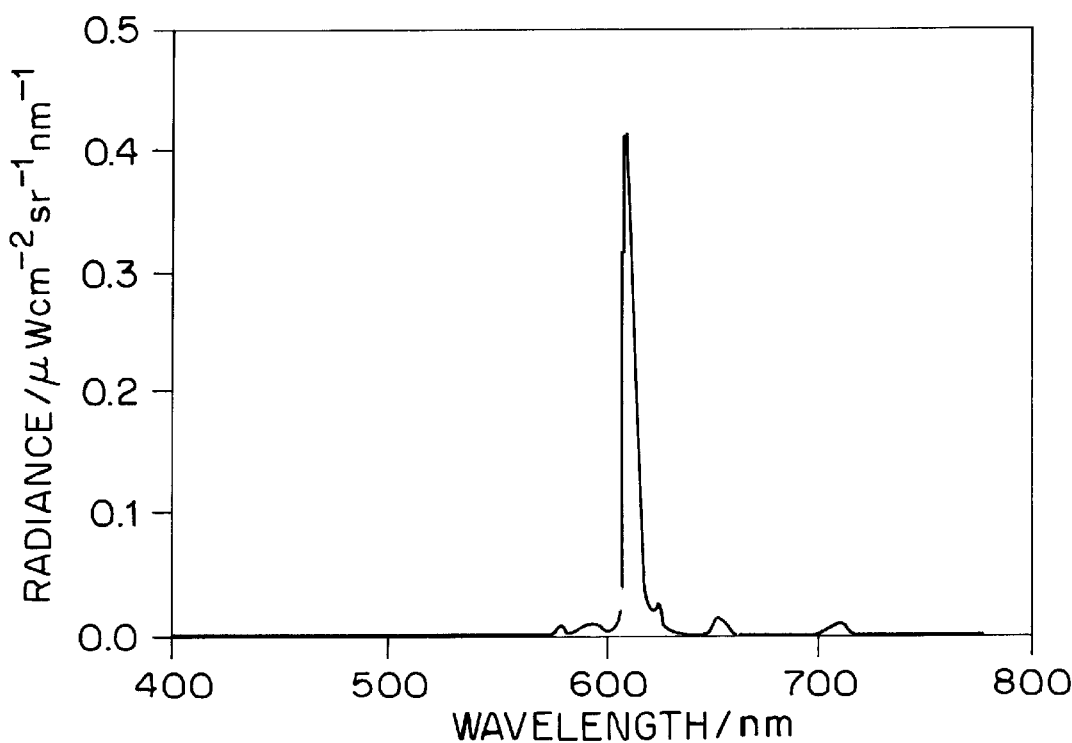
Figure 7A:
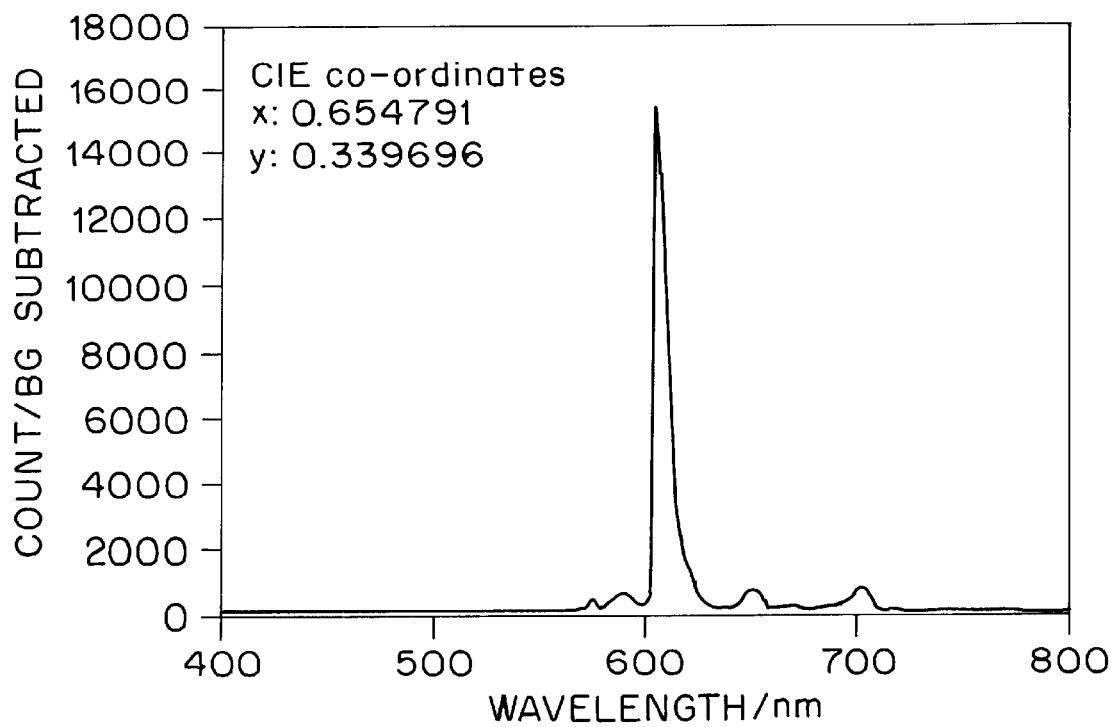
FIGS. 7(a) and 7(b) are graphs of counts versus wavelength and radiance versus wavelength, respectively, for a Europium (III) dibenzoyl methane diphenyl phosphoninide tris(methoxyphenyl) phosphorane substrate in accordance with the invention.
Figure 7B:
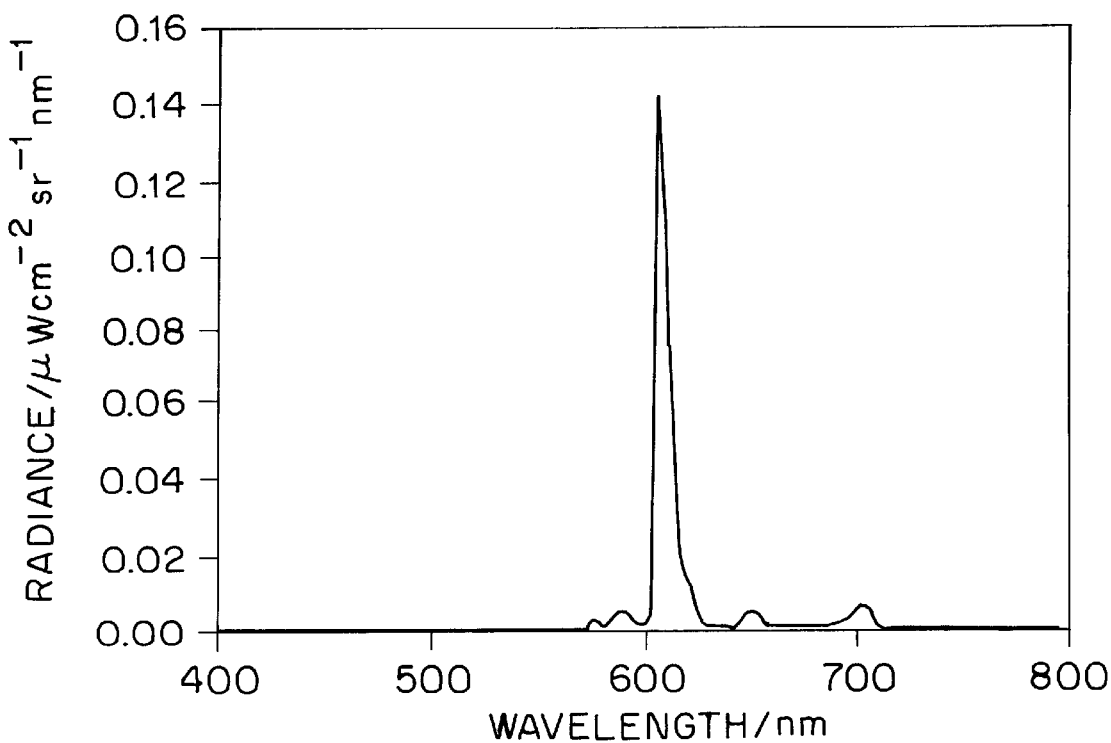
Figure 8A:
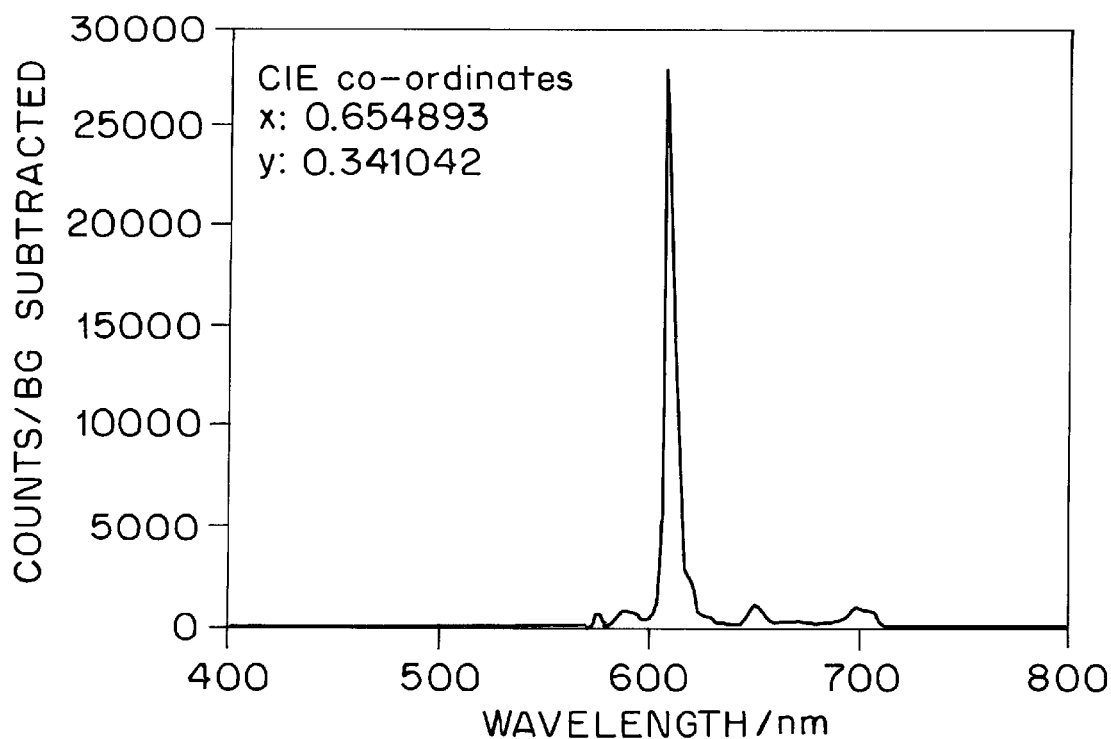
FIGS. 8(a) and 8(b) are graphs of counts versus wavelength and radiance versus wavelength, respectively, for a Europium (III) dibenzoyl methane diphenyl phosphonimide tris(fluorophonimide) phosphorane substrate in accordance with the invention.
Figure 8B:
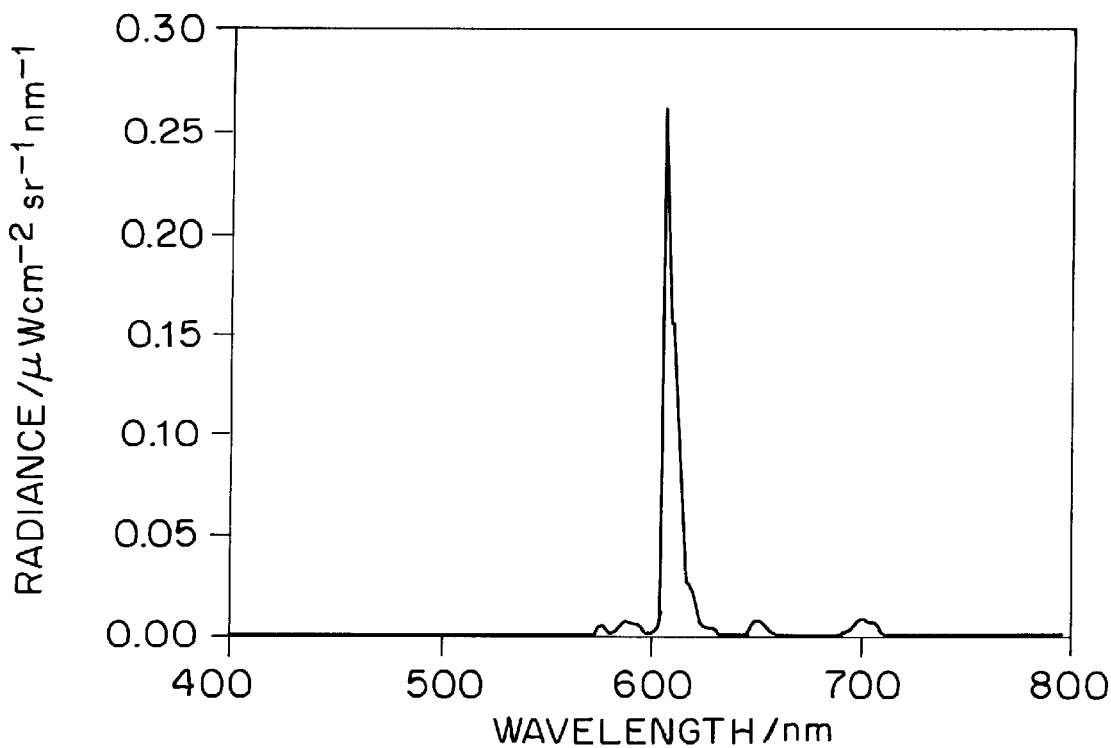
Figure 9A:
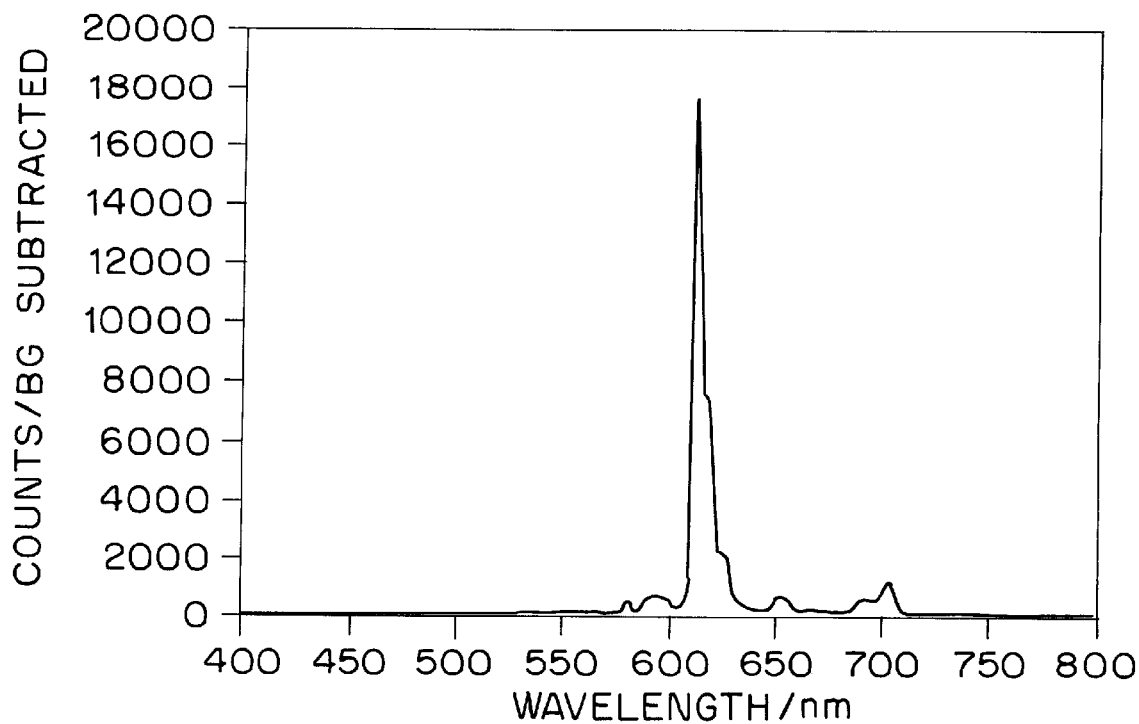
FIGS. 9(a) and 9(b) are graphs of counts versus wavelength and radiance versus wavelength, respectively, for a Europium (111) dibenzoyl methane 4,7-diphenyl-1,10-phenanthroline substrate in accordance with the invention.
Figure 9B:
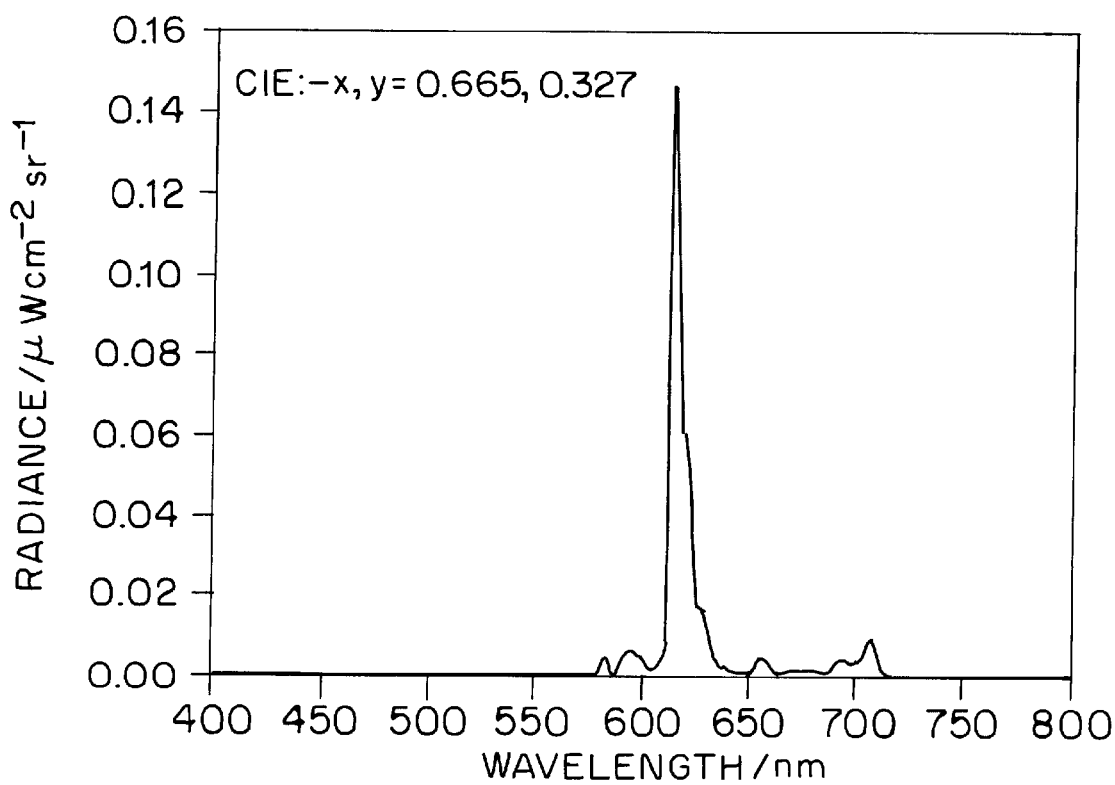
Figure 10A:
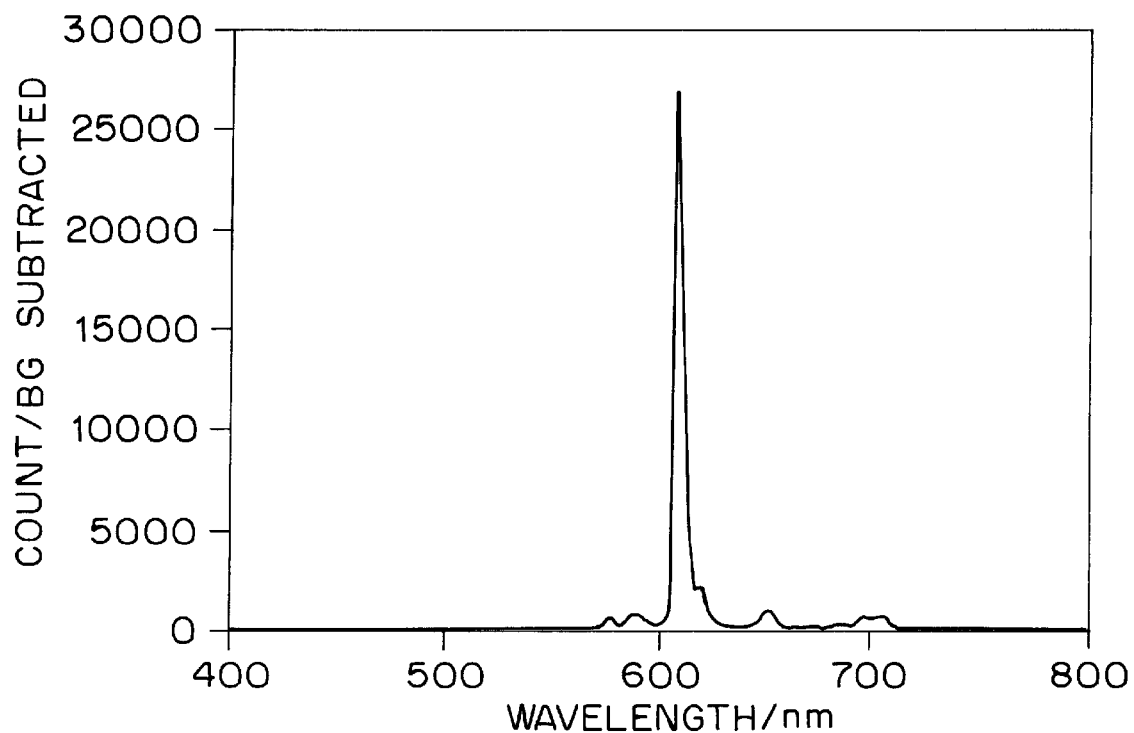
FIGS. 10(a) and 10(b) are graphs of counts versus wavelength and radiance versus wavelength, respectively, for a Europium (FOD) OPNP substrate in accordance with the invention.
Figure 10B:
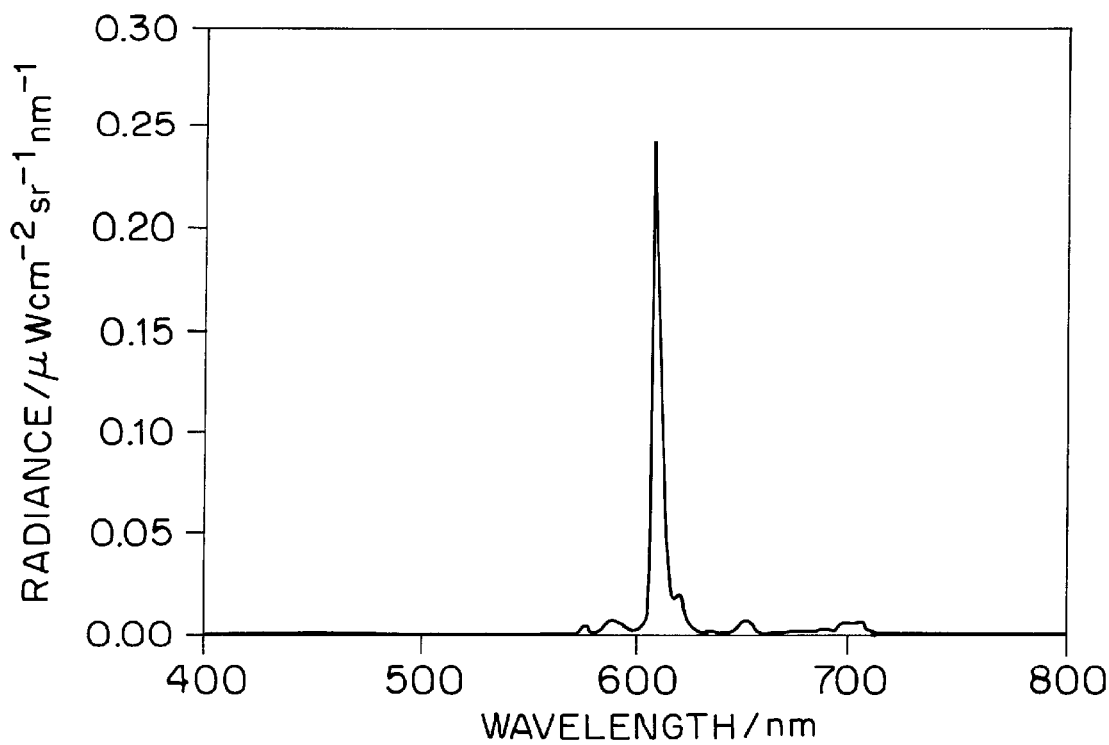
Figure 11A:
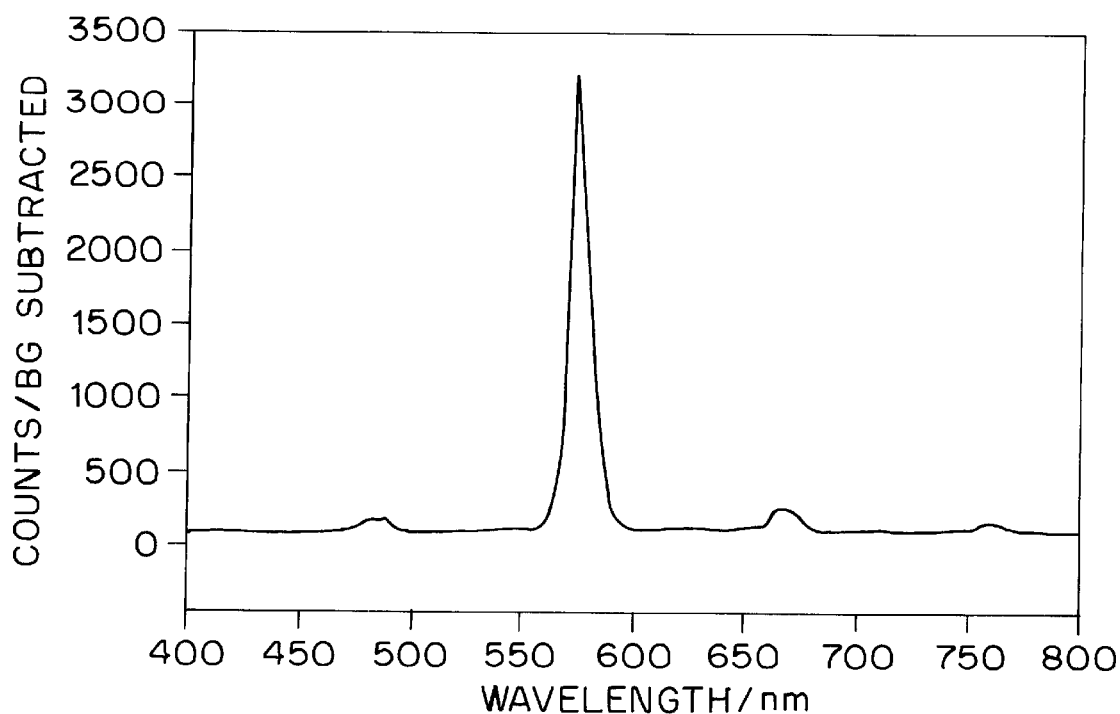
FIGS. 11(a) and 11(b) are graphs of counts versus wavelength and radiance versus wavelength, respectively, for a tris (2,2,6,6-tetramethyl-3,5-heptanedionato) Dysprosium (III) diphenyl phosphonimido triphenylphosphorane substrate in accordance with the invention.
Figure 11B:
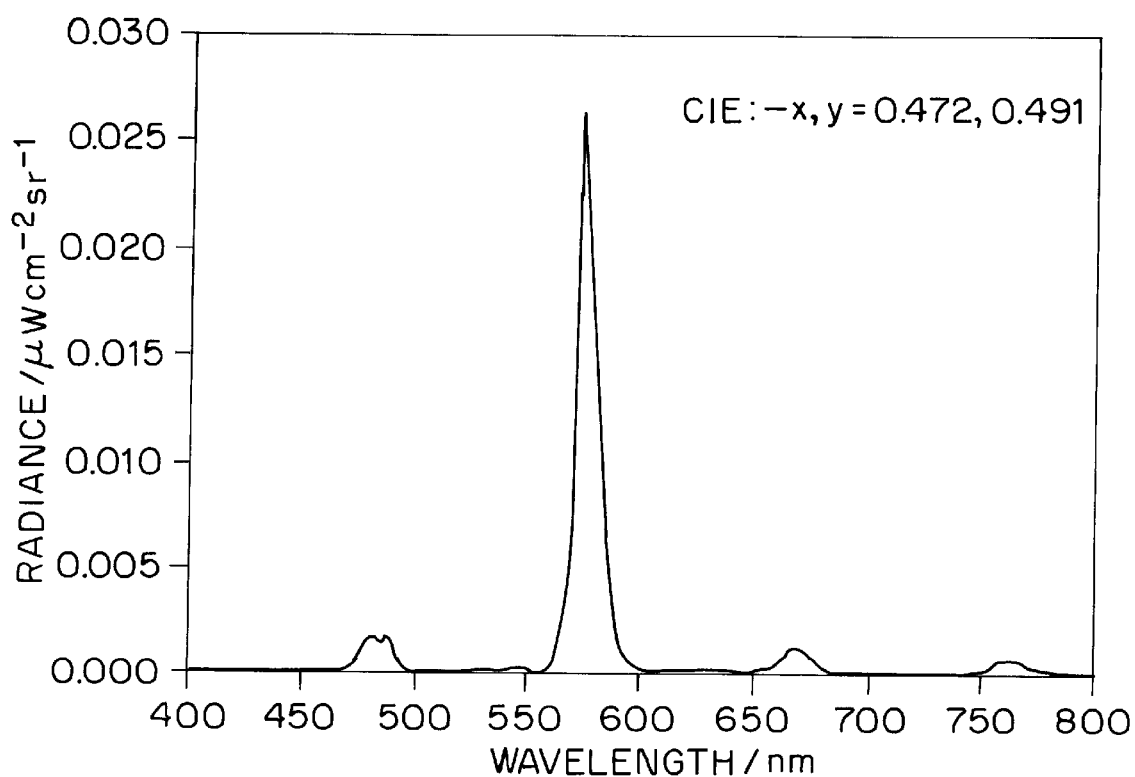
Figure 12:
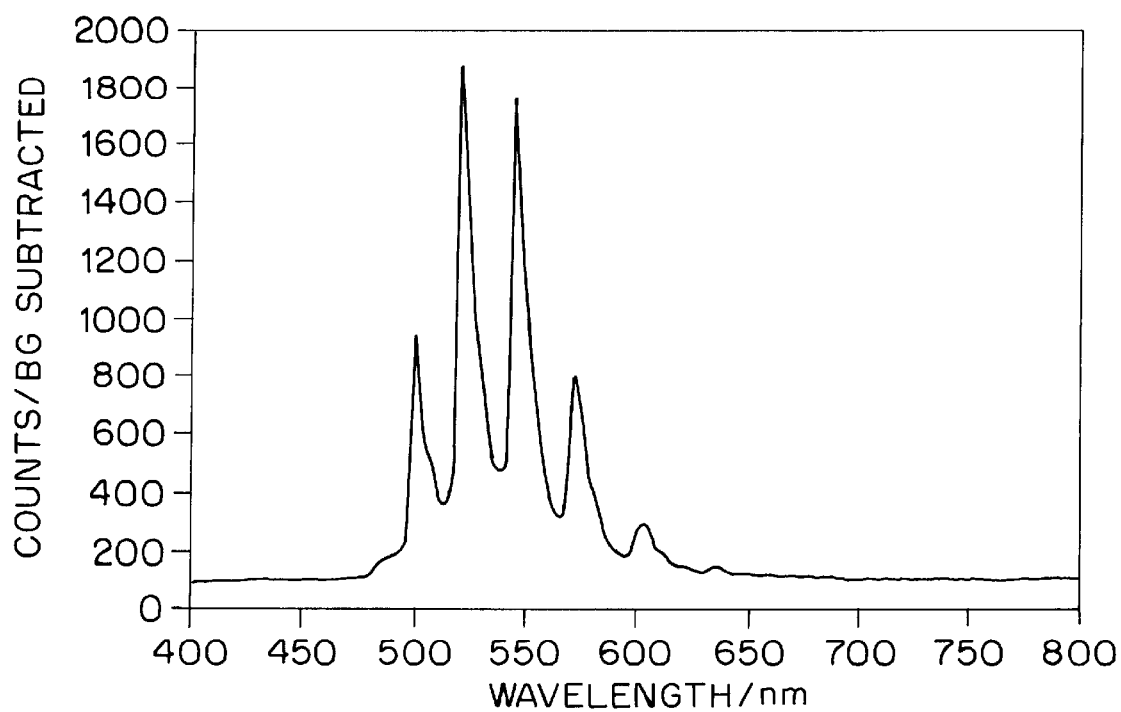
FIGS. 12(a) and 12(b) are graphs of counts versus wavelength and radiance versus wavelength, respectively, for a bis(imidotetraphenyldiphosphinic acid) uranium dioxide substrate in accordance with the invention.
Figure 12:
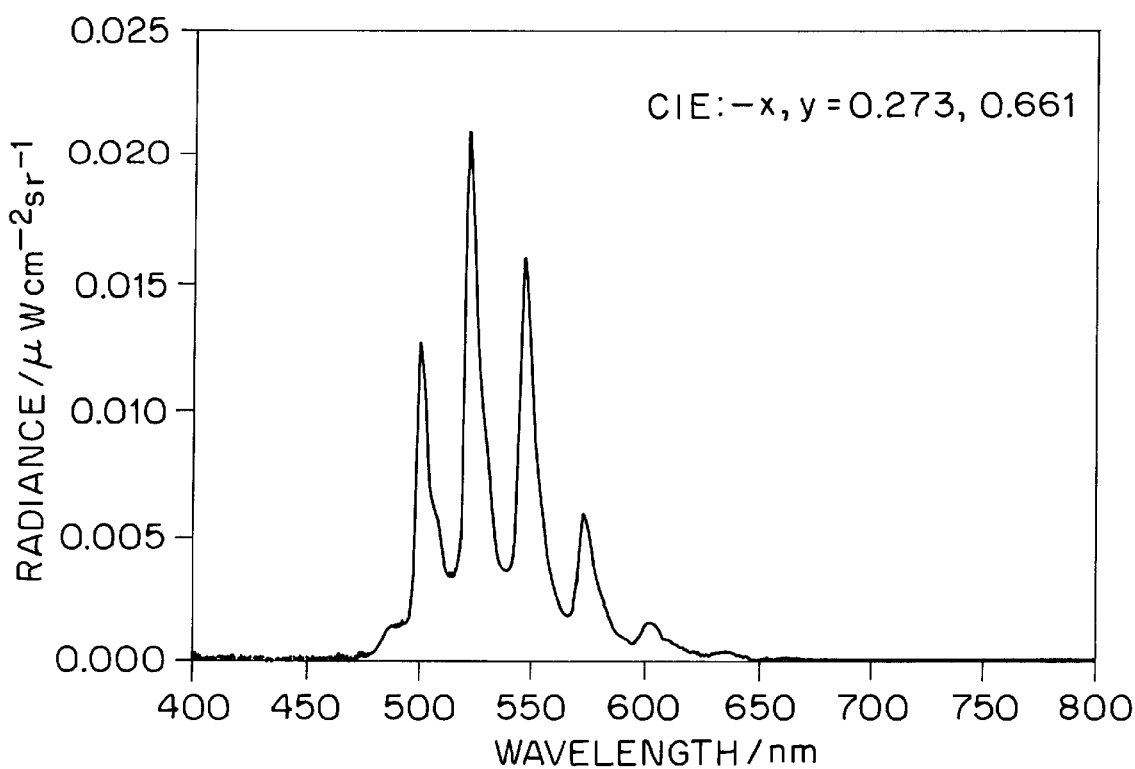
Figure 13A:
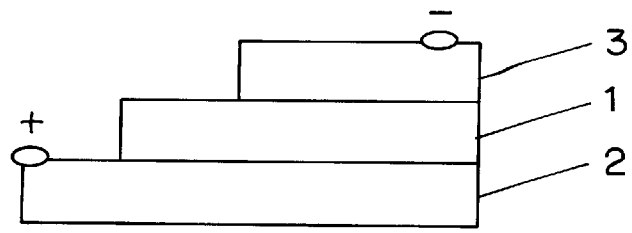
FIGS. 13(a)–(d) are schematic representations of composite devices made in accordance with the invention.
Figure 13B:
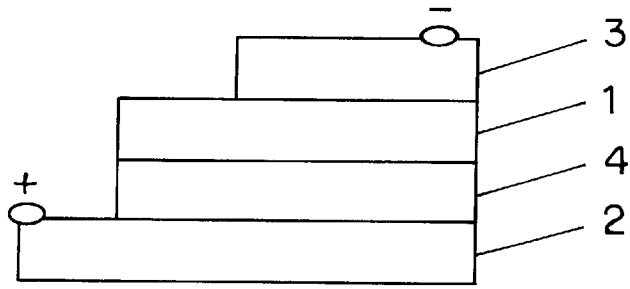
Figure 13C:
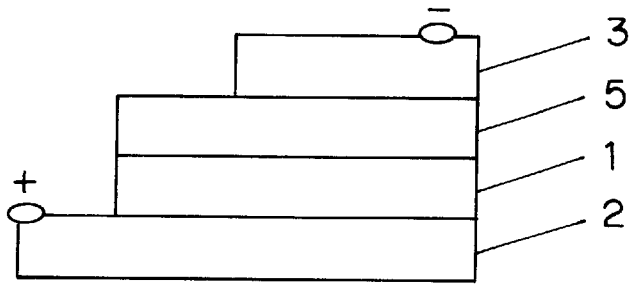
Figure 13D:
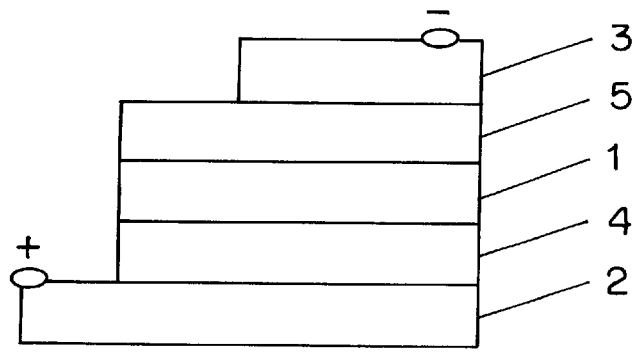

This is diagrammatically illustrated in FIG. 1 of the accompanying drawings

Any metal ion having an unfilled inner shell can be used as the metal and the preferred metals are Sm(III), Eu(III), Tb(III), Dy(III), Yb(III), Lu(III), Gd(III), Eu(II), Gd(III) U(III), UO$_2$(VI), Th(III)

Preferred chelating groups have the formula

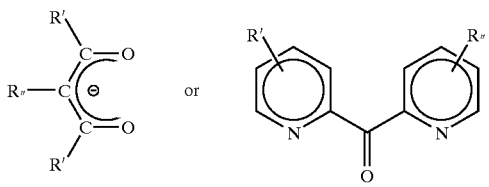

where R' maybe the same or different at different parts of the molecule and each of R" and R' is an aromatic or heterocyclic ring structure which may be substituted or a hydrocarbyl of a fluorocarbon or R" is a halogen such as fluorine or hydrogen. R" can also be copolymerisable with a monomer e.g. styrene R' can be t-butyl and R" hydrogen.

Examples of metal chelates are (a) terbium (III) dipivatoyl methide)$_3$, known as terbium tris(2,2,6,6-tetramethy 3,5 heptane dionato)chelate, (b) di- and tri-pyrazolyl borate and the di- and tri-pyrazolyl-N-oxide borate adducts of (a), (c) europium (III) (2-naphthyl trifluoro acetyl acetonate) or (d) uranyl (2-naphthyl trifluoro acetyl acetonate or the dipyridyl and dipyridyl N-oxide adducts of (c) and (d).

EP 0744451A1 discloses fluorescent compounds which are complexes of transition, metal, lanthanide and actinide chelates and methods for making these, it has been found that these complexes are electroluminescent and by the selection of the metal ion and complex as referred to above a high efficiency electroluminescent material of a specific colour can be prepared.

The devices of the invention comprise an transparent substrate which is a conductive glass or plastic material which acts as the cathode, preferred substrates are conductive glasses such as indium tin oxide coated glass, but any glass which is conductive or has a conductive layer can be used. Conductive polymers and conductive polymer coated glass or plastics materials can also be used as the substrate. The electroluminescent material can be deposited on the substrate directly by evaporation from a solution of the material in an organic solvent. The solvent which is used will depend on the material but chlorinated hydrocarbons such as dichloromethane are suitable in many cases.

Alternatively the material can be deposited by spin coating or by vacuum deposition from the solid state e.g. by sputtering or any other conventional method can be used.

In one embodiment of the invention there is a hole transporting layer deposited on the transparent substrate and the electroluminescent material is deposited on the hole transporting layer. The hole transporting layer serves to transport holes and to block the electrons, thus preventing electrons from moving into the electrode without recombining with holes. The recombination of carriers therefore mainly takes place in the emitter layer.

Hole transporting layers are used in polymer electroluminescent devices and any of the known hole transporting materials in film form can be used.

The hole transporting layer can be made of a film of an aromatic amine complex such as poly(vinylcarbazole), N,N'-diphenyl-N,N'-bis(3-methylphenyl)-1,1'-biphenyl-4,4'-diamine (TPD), polyaniline etc.

The hole transporting material can optionally be mixed with the electroluminescent material in a ratio of 5–95% of the electroluminescent material to 95 to 5% of the hole transporting compound.

In another embodiment of the invention there is a layer of an electron injecting material between the cathode and the electroluminescent material layer, this electron injecting material is preferably a metal complex such as a metal quinolate e.g. an aluminium quinolate which will transport electrons when an electric current is passed through it. Alternatively the electron injecting material can be mixed with the electroluminescent material and co-deposited with it.

In a preferred structure there is a substrate formed of a transparent conductive material which is the anode on which is successively deposited a hole transportation layer, the electroluminescent layer and an electron injection layer which is connected to the anode. The anode can be any low work function metal e.g. aluminium, calcium, lithium, silver/magnesium alloys etc., aluminium is a preferred metal.

It is a feature of the invention that by forming a layer on the substrate which is a mixture of electroluminescent materials which emit different colour light the emitted light will have a colour which is an additive colour of the individual colours.

Another feature of the invention is that by having a plurality of layers emitting different colour light sequentially deposited on the substrate a light which is an additive combination of the individual colours is emitted, thus by having layers which emit green, red and blue light, white light will be emitted.

In this structure the thickness of the layers are chosen so that recombination of electrons and holes on passage of an electric current takes place in the electroluminescent layer.

In general the thickness of the layers is from 20 nm to 200 nm.

It is possible to co-deposit mixtures of the electroluminescent metal complexes from solution so that the colour of the emitted light can be modified, in this way the desired colours can be selected.

The electroluminescent devices of the present invention give light with a narrow wave band with a very bright emission and it is possible to emit light in a range of colours.

Schematic diagrams of devices according to the invention are illustrated in FIGS. 13a, 13b, 13c and 13d. In these drawings (1) is the emissive layer, (2) is ITO, (3) is an electron transporting layer and (4) is a hole transporting layer.

The invention is described in the following Examples
1. Device Fabrication

An ITO coated glass piece (1×1 cm² cut from large sheets purchased from Balzers, Switzerland) had a portion etched out with concentrated hydrochloric acid to remove the ITO and was cleaned and placed on a spin coater (CPS 10 BM, Semitec, Germany)and spun at 2000 rpm for 30 seconds, during which time the solution of the electroluminescent compound was dropped onto it dropwise by a pipette.

Alternatively the electroluminescent compound was vacuum evaporated onto the ITO coated glass piece by placing the substrate in a vacuum coater and evaporating the electroluminescent compound at 10⁻⁵ to 10⁻⁶ torr onto the substrate.

The organic coating on the portion which had been etched with the concentrated hydrochloric acid was wiped with a cotton bud.

The coated electrodes were stored in a vacuum desiccator over calcium sulphate until they were loaded into a vacuum coater (Edwards, $10^{-6}$ torr) and aluminium top contacts made. The active area of the LED's was 0.08 cm$^{2-}$–0.1 cm² the devices were then kept in a vacuum desiccator until the electroluminescence studies were performed.

The ITO electrode was always connected to the positive terminal.

The current vs. voltage studies were carried out on a computer controlled Keitlly 2400 source meter.

Electroluminescence spectra were recorded by means of a computer controlled charge coupled device on Insta Spec photodiode array system model 77112 (Oriel Co., Surrey, England).

2. Photoluminescence Measurements

Photoluminescence was excited using 325 nm line of Liconix 4207 NB, He/Cd laser. The laser power incident at the sample (0.3 mWcm$^{-2}$) was measured by a Liconix 55PM laser power meter. The radiance calibration was carried out using Bentham radiance standard (Bentham SRS8, Lamp current 4,000 A, calibrated by National Physical laboratories, England. The PL studies were carried out on samples or films.

Examples 2 to 12 are examples of the synthesis of electroluminescent compounds of the invention and Example 1 is an example of the known complex.

EXAMPLE 1

Tris(2,2,6,6-tetramethyl-3,5-heptanedionato)terbium (III) [Tb(TMHD)₃]Diphenyl Phosponimide Tris-phenyl Phosphorane—in (I) R is H.

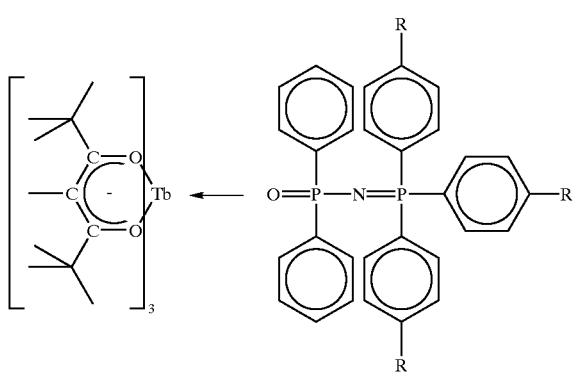

(I)

[Tb(TMHD)₃] (1 mM) was mixed with 1 mM of diphenylphosphinic-azide in 5 ml trimethyl pentane and the mixture heated to reflux until a clear solution was obtained (about 1 hour). The solution was allowed to clear yielding tris(2,2,6,6-tetranethyl-3,5- heptanedionato)Terbium (III) di phenyl phosponimide tris-pheriyl phosphorane as a crystalline solid m.p. 246–248° C. in nearly quantitative yield.

EXAMPLE 2

Tris(2,2,6,6-tetramethyl-3,5-heptanedionato)terbium (III) Phosponimide Tris-(tolylphenyl)phosphorane— in (I) R is CH₃

Tris-(2,2,6,6-tetramethyl-3,5-heptanedionato)Terbium (III) (0.2 g, 0.28 mmol) and diphenyl phosponimide tris-(tolylphenyl)phosphorane (0.145 g, 0.28 mmol) was heated at reflux in 2.2.4-trimethyl pentane until all solid went into solution (ca 3 hours). Then the solution was allowed to cool to room temperature. The resultant precipitate was filtered off and dried in vacuo at 50° C. to yield a white solid (0.211 g) which was tris(2,2,6,6-tetramethyl-3,5-heptanedionato) Terbium (III) phosponimide tris-(tolylphenyl)phosphorane m.p. 94–98° C.

EXAMPLE 3

Tris(2,2,6,6-tetramethyl-3,5-heptanedionato)terbium (III) Diphenyl Phosponimide Tris-(methoxyphenyl) phosphorane—in (I) R is OCH₃

Tris-(2,2,6,6-tetramethyl-3,5-heptanedionato)Terbium (III) (0.2 g, 0.28 mmol) and diphenyl phosponimide tris-(methoxyphenyl)-phosphorane (0.159 g, 0.28 mmol) was heated at reflux in 2.2.4-trimethyl pentane until all solid went into solution (ca 3 hours) Then the solution was allowed to cool to room temperature. The resultant precipitate was filtered off and dried in vacuo at 50° C. to yield a white solid (0.211 g) which was tris(2,2,6,6-tetramethyl-3, 5-heptanedionato)Terbium (III) diphenyl phosponimide tris-(methoxyphenyl)phosphorane.

EXAMPLE 4

Tris(2,2,6,6-tetramethyl-3,5-heptanedionato)terbium (III) Diphenyl Phosponimide Tris-(fluorophenyl) phosphorane—in (I) R is F Tris-(2,2,6,6-tetramethyl-3,5-heptanedionato)Terbium (EH) (0.2 g, 0.28 mmol) and diphenyl phosponimide tris-(fluorophenyl)phosphorane (0.157 g, 0.28 mmol) was heated at reflux in 2.2.4-trimethyl pentane until all solid went into solution (ca 3 hours) Then the solution was allowed to cool to room temperature. The resultant precipitate was filtered off and dried in vacuo at 50° C. to yield a white solid (0.226 g) which was tris(2,2,6,6-tetramethyl-3,5-heptanedionato) terbium (111) diphenyl phosponimide tris-(fluorophenyl) phosphorane m.p. 104–108° C.

EXAMPLE 5

Tris(2,2,6,6'-tetramethyl-3,5-heptanedionato)terbium (III) Mono-di-(2-pyridyl)ketone.

Tris (2,2,6,6'-tetramethyl-3,5-heptanedionato)terbium (III) (0.71 g 1 mmol) was dissolved in ethanol (100 ml) at 40 ° C. whilst stirring. Di-(2-pyridyl)ketone (0.18 g, 1 mmol) was added. The mixture was stirred for 1 hour and the clear yellow solution dried in vacuo to give a pale yellow product (0.84 g) which was Tris (2,2,6,6'-tetramethyl-3,5-heptanedionato)terbium (III) monodi-(2-pyridyl)ketone (Yield 84%).

EXAMPLE 6

Europium (III) Dibenzoyl Methane (DBM) Diphenyl Phosphonimide Triphenyl Phosphorane Europium (III) (DBM) (0.5 g, 60.2 mmol) and diphenyl phosphonimide triphenyl phosphorane (OPNP) (0.574 g, 1.294 mmol) were melted together at 200° C. in an oven and held at that temperature for 1 hour. The resultant mixture was dissolved in hot toluene (10 ml) and added dropwise to cold (ice/water)trimethylpentane (150 ml) to precipitate the complex. The precipitate was filtered off and dried in vacuo at 50° C. to yield a yellow solid (0.72 g) which was Europium (III) dibenzoyl methane diphenyl phosphonimide triphenyl phosphorane m.p. 272–276° C.

EXAMPLE 7

Europium (III) Dibenzoyl Methane (DBM) Diphenyl Phosphonimide Tris(methoxyphenyl) phosphorane—in (II) R is $OCH_3$

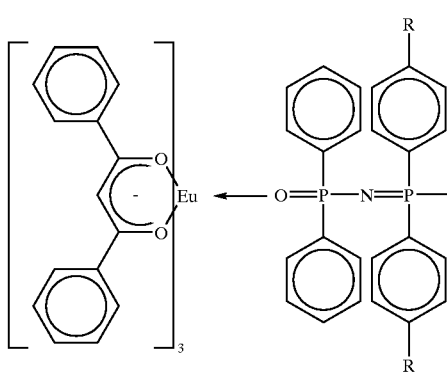

(II)

Europium (III) (DBM) (0.5 g, 0.602 mmol) and diphenyl phosphonimide trismethoxy phosphorane (OPNPCH₃) (0.683 g, 1.20 mmol) were melted together at 200° C. in an oven and held at that temperature for 1 hour. The resultant mixture was dissolved in hot toluene (10 ml) and added dropwise to cold (ice/water)trimethylpentane (150 ml) to precipitate the complex. The precipitate was filtered off and air dried to yield a yellow solid (0.503 g) which was Europium (III) dibenzoyl methane diphenyl phosphonimide trismethoxy phosphorane m.p. 150–154° C.

EXAMPLE 8

Europium (III) Dibenzoyl Methane (DBM) Diphenyl Phosphonimide Tris(fluorophenyl) phosphorane—in (II) R is F

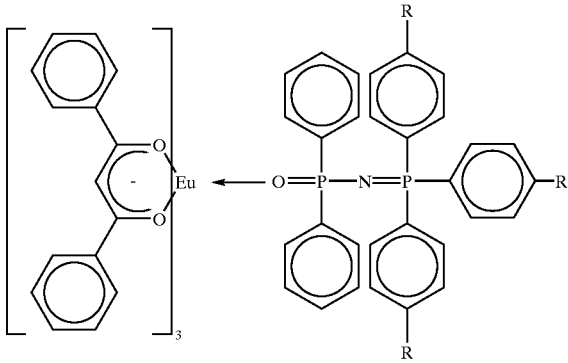

(II)

Europium (III) (DBM) (0.285 g, 0.343 mmol) and diphenyl phosphonimide trisfluoro phosphorane (OPNPF) (0.385 g, 0.686 mmol) were melted together at 200° C. in an oven and held at that temperature for 1 hour. The resultant mixture was dissolved in hot toluene (10 ml) and added dropwise to cold (ice/water) trimethylpentane (150 ml) to precipitate the complex. The precipitate was filtered off and air dried to yield a yellow solid (0.562 g) which was Europium (III) dibenzoyl methane diphenyl phosphonimide trisfluoro phosphorane m.p. 218–222° C.

EXAMPLE 9

Europium (III) dibenzoyl methane (DBM) 4,7-Diphenyl-1,10-Phenanthroline

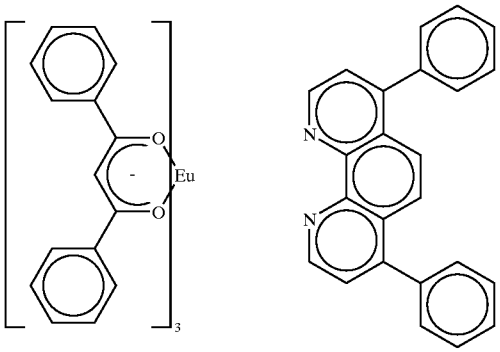

Europium (III) dibenzoyl methane (DBM) (0.5 g, 0.6 mmol) was heated at reflux with 4,7-ditphenyl-1,10 phenathroline (0.2 g 0.6 mmol) in chloroform (5 ml) overnight. The solvent was removed in vacuo to yield an orange solid (0.66 g) which was europium (III) dibenzoyl methane (DBM) 4,7-diphenyl-1,10-phenanthroline m.p.>250° C.

EXAMPLE 10

Europium (FOD) OPNP

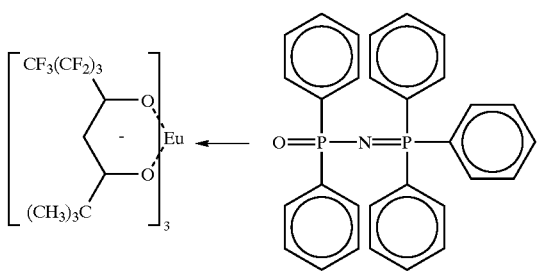

Europium FOD (0.5 g, 0.482 mmol) and OPNP (0.230 g, 0.484 mmol) was dissolved in chloroform (15 ml) and the resulting solution heated at reflux overnight. The solvent was removed in vacuo to yield a yellow solid which was europium (FOD) OPNP m.p. 212–214° C.

EXAMPLE 11

Tris(2,2,6,6-tetramethyl-3,5-heptanedionato) dysprosium (III) Diphenyl Phosponimido Triphenylphosphorane Tris(2,2,6,6-tetramethyl-3,5-heptanedionato)dysprosium (III) (6.1 g, 19.5 mmole) and diphenyl phosponimido triphenylphosphorane. (4.6 g, 9.5 mmole) were refluxed in trimethylpentane (60 ml) for 30 minutes. The reaction mixture was the allowed to cool to room temperature. A white crystalline material formed on standing. This was recrystallised from diethyl ether to give tris(2,2,6,6-tetramethyl-3,5-heptanedionato) dysprosium (III) diphenyl phosponimido triphenylphosphorane yield: 8 gm., pt.154° C.)

EXAMPLE 12

Bis(imidotetraphenyldiphosphinic acid) Uranium Dioxide

Imidotetraphenyldiphosphinic acid (4.3 g, 10.3 mmole) and sodium hydroxide (0.412 g. 10.3 mmole)were heated to 60° C. in 90% aqueous ethanol (100 ml). Uranyl acetate was then added quickly and the reaction mixture heated to reflux for 20 minutes. the reaction mixture was cooled to room temperature, filtered, washed with ethanol (300 ml) and dried under vacuum to give a yellow solid which was bis (imidotetraphenyldiphosphinic acid) Uranium dioxide (yield 4.4 g).

The products of Examples 1 to 11 were formed into devices and their Photoluminescent Efficiency was measured according to the method described in the Article in Chemical Physics Letters 241 (1995)89–96 by N. C. Greenham et al and the results are shown in Table 1.

TABLE 1

| Example | Photoluminescent Efficiency |
|---|---|
| 1 | 85% |
| 2 | 90% |
| 3 | 90% |
| 4 | 95% |
| 5 | 40% |
| 6 | 90% |
| 7 | 30% |

TABLE 1-continued

| Example | Photoluminescent Efficiency |
|---|---|
| 8 | 55% |
| 9 | 64% |
| 10 | 43% |
| 11 | 77% |
| 12 | 87% |

Td(TMHD)$_3$ had a photoluminescent efficiency of 25%, terbium (III) acetyl acetonate complex had a photoluminescent efficiency of 20% and europium (III) phenthrancene complex had a photoluminescent efficiency of 19%.

The spectra are shown in FIGS. 1 to 11 which show the colours and narrow frequency band of the compounds.

In Tb(TMHD)$_3$, terbium (III) acetyl acetonate complex and europium (III) phenanthranene complex the difference between the triplet state of the ligand and the excited states of the metal ion was in order of >0.6 eV in the compounds of the invention the difference was of the order of <or=to 0.4 eV in the case of the terbium complexes and <or=0.3 eV in the case of the Europium complexes.

As can be seen photoluminescent materials with high photoluminescent efficiencies can be made.

EXAMPLE 13

Composite devices were made according to FIG. 13 and their properties measured. The results are given in table 2.

TABLE 2

| System | Applied Voltage/V Volts | Current/ A Amps | Brightness cdm$^2$ | Luminous Efficiency lmW$^{-1}$ | CIE Colour x | y |
|---|---|---|---|---|---|---|
| 1 | 15 | 11 × 10$^{-3}$ | 540 | 1.6 × 10$^{-2}$ | 0.31 | 0.59 |
| 2 | 20 | 1.5 × 10$^{-5}$ | 3600 | 60 | 0.31 | 0.59 |
| 3 | 18 | 4 × 10$^{-6}$ | 1935 | 137 | 0.31 | 0.59 |
| 4 | 27 | 9.7 × 10$^{-3}$ | 1200 | 2.3 | 0.31 | 0.59 |
| 5 | 20 | 4 × 10$^{-4}$ | 441 | 0.3 | 0.64 | 0.35 |
| 6 | 20 | 1.0 × 10$^{-3}$ | 9000 | 0.4 | 0.65 | 0.33 |
| 7 | 25 | 1.5 × 10$^{-2}$ | 50 | 6.8 × 10$^{-4}$ | 0.65 | 0.33 |
| 8 | 26 | 1.4 × 10$^{-2}$ | 100 | 1.4 × 10$^{-3}$ | 0.47 | 0.49 |

In Table 2

The Systems comprised the layers:

1. ITO|Tb(TMHD)$_3$OPNP|Al
2. ITO|TPD|Tb(TMHD)$_3$OPNP|Al
3. ITO|TPD|Tb(TMHD)$_3$OPNP|AlQ|Al
4. ITO|PANI|Tb(TMHD)$_3$OPNP|Al
5. ITO|TPD|Eu(DBM)$_3$OPNP|Al
6. ITO|TPD|Eu(DBM)$_3$OPNP|AlQ|Al
7. ITO|PANI|Eu(DBM)$_3$OPNP|Al
8. ITO|PANI|Dy(DBM)$_3$OPNP|Al

Where ITO is indium tin coated glass, PANI is polyaniline ALQ is aluminium trisqinolate and TPD, (TMHD)$_3$, OPNP, (DBM)$_3$ are as in the examples.

What is claimed is:

1. An electroluminescent device comprising:
  a transparent substrate, and a layer comprising an electroluminescent material above the substrate wherein the electroluminescent material comprises at least one complex selected from the group consisting of a rare earth metal complex, an actinide complex and a transition metal complex wherein the electroluminescent device has a photoluminescent efficiency of greater than 25%, the complex having the formula $X(Y_m)_n$ where X is a rare earth metal, actinide or transition metal and n is the valence state of the metal, and $Y_m$ is the same or different ligand wherein at least one $Y_m$ is

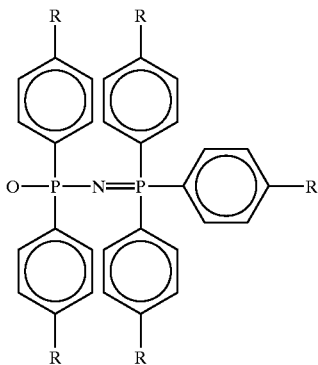

where R is the same or different and is selected from the group consisting of hydrogen, hydrocarbyl, alkoxy, fluorine, nitrile, fluorocarbon, phenyl, substituted phenyl and a phenoxy moiety, and wherein each phenyl group has from 1 to 5 R substituents.

2. An electroluminescent material in accordance with claim 1 wherein the electroluminescent material has a photoluminescent efficiency of greater than 40%.

3. An electroluminescent device as in claim 1 wherein X is selected from the group consisting of Sm(III), Eu(II), Tb(III), Dy(III), Yb(III), Lu(III), Gd(III), Eu(III), Gd(III), U(III), U(VI)O$_2$ and Th(III).

4. An electroluminescent device according to claim 1 wherein a triplet state of the at least one ligand is no greater than 0.6 eV above a resonant frequency of the metal ion in said complex.

5. An electroluminescent device according to claim 1 wherein a triplet state of the at least one ligand is no greater than 0.4 eV above a resonant frequency of the metal ion in said complex.

6. An electroluminescent device according to claim 3 wherein a triplet state of the at least one ligand is no greater than 0.6 eV above a resonant frequency of the metal ion in said complex.

7. An electroluminescent device according to claim 3 wherein a triplet state of the at least one ligand is no greater than 0.4 eV above a resonant frequency of the metal ion in said complex.

8. An electroluminescent device according to claim 2 further comprising a hole transporting layer deposited on the transparent substrate and wherein the electroluminescent material is deposited on the hole transporting layer.

9. An electroluminescent device according to claim 2 wherein the layer includes a hole transporting material mixed with the electroluminescent material in a ratio of 5 to 95% of the electroluminescent material to 95 to 5% of the hole transporting material.

10. An electroluminescent device according to claim 9 wherein the hole transporting material is an aromatic amine complex.

11. An electroluminescent device according to claim 9 wherein the hole transporting material is selected from the group consisting of poly(vinylcarbazole),N,N' diphenyl-N, $N^1$-bis(3-methylphenyl)-1,1$^1$-biphenyl-4,4$^1$-diamine and polyaniline.

12. An electroluminescent device according to claim 2 wherein the layer comprises an electron injecting material mixed with the electroluminescent material.

13. An electroluminescent device according to claim 12 wherein the electron injecting material is selected from the group consisting of a metal complex, oxadiazole, an oxadiazole derivative, an aluminum quinolate and 2-(4-biphenyl)-5-(4-tert-butylphenyl)-1,3,4 oxadiazole.

* * * * *

UNITED STATES PATENT AND TRADEMARK OFFICE
CERTIFICATE OF CORRECTION

PATENT NO.     : 6,524,727 B1
DATED          : February 25, 2003
INVENTOR(S)    : Poopathy Kathirgamanathan It is certified that error appears in the above-identified patent and that said Letters Patent is hereby corrected as shown below:

Column 6,
Line 46, reads as "(EH) (0.2 g, 0.28 mmol) and diphenyl phosponimide tris-"
should read as -- (III) (0.2 g, 0.28 mmol) and diphenyl phosponimide tris- --

Signed and Sealed this

Twenty-eighth Day of October, 2003

JAMES E. ROGAN
*Director of the United States Patent and Trademark Office*